(12) United States Patent
Ito

(10) Patent No.: US 7,805,643 B2
(45) Date of Patent: Sep. 28, 2010

(54) NON-VOLATILE SEMICONDUCTOR MEMORY DEVICE

(75) Inventor: Shinya Ito, Kawasaki (JP)

(73) Assignee: Fujitsu Semiconductor Limited, Yokohama (JP)

( * ) Notice: Subject to any disclaimer, the term of this patent is extended or adjusted under 35 U.S.C. 154(b) by 929 days.

(21) Appl. No.: 11/649,916

(22) Filed: Jan. 5, 2007

(65) Prior Publication Data

US 2008/0059849 A1    Mar. 6, 2008

(30) Foreign Application Priority Data

Sep. 1, 2006   (JP)   ............................ 2006-238119

(51) Int. Cl.
*G11C 29/00* (2006.01)

(52) U.S. Cl. ...................................... 714/718

(58) Field of Classification Search ................ 714/718, 714/719, 733; 365/185.18, 229
See application file for complete search history.

(56) References Cited

U.S. PATENT DOCUMENTS

| | | | | |
|---|---|---|---|---|
| 5,568,441 A * | 10/1996 | Sanemitsu | .................. | 365/229 |
| 5,577,050 A * | 11/1996 | Bair et al. | .................... | 714/710 |
| 6,055,200 A | 4/2000 | Choi et al. | | |
| 6,496,947 B1 * | 12/2002 | Schwarz | ....................... | 714/30 |
| 6,597,603 B2 * | 7/2003 | Lambrache et al. | ..... | 365/185.18 |
| 7,073,100 B2 * | 7/2006 | Chadwick et al. | ............ | 714/718 |
| 7,366,019 B2 * | 4/2008 | Kubo | ..................... | 365/185.18 |
| 7,424,660 B2 * | 9/2008 | Kebichi et al. | .............. | 714/744 |
| 7,447,950 B2 * | 11/2008 | Takahashi et al. | ............ | 714/702 |
| 7,484,140 B2 * | 1/2009 | Pelley et al. | ................. | 714/718 |
| 2003/0231532 A1 * | 12/2003 | Micheloni et al. | ............ | 365/200 |

FOREIGN PATENT DOCUMENTS

| | | |
|---|---|---|
| JP | 06-314500 | 11/1994 |
| JP | 11-051721 A | 2/1999 |
| JP | 2000-149596 A | 5/2000 |
| JP | 2000-299000 A | 10/2000 |
| JP | 2004-061114 A | 2/2004 |
| JP | 2005-016957 A | 1/2005 |

* cited by examiner

*Primary Examiner*—James C Kerveros

(57) ABSTRACT

A cut-off circuit cuts off supply of a power supply voltage from a voltage supply circuit to a non-volatile memory block. A discharge circuit discharges an electric charge accumulated in stability capacitance. In a data retention test of the memory block, a self test circuit instructs the cut-off circuit to start operation after writing predetermined data into the memory block, and instructs the cut-off circuit to stop the operation to check retention of the predetermined data in the memory block in a predetermined time after the instruction to the cut-off circuit to start the operation. Further, in the data retention test of the memory block, the self test circuit instructs the discharge circuit to start operation along with the instruction to the cut-off circuit to start the operation, and instructs the discharge circuit to stop the operation along with the instruction to the cut-off circuit to stop the operation.

10 Claims, 4 Drawing Sheets

NON-VOLATILE SEMICONDUCTOR MEMORY DEVICE

CROSS REFERENCE TO RELATED APPLICATION

This application is based upon and claims the benefit of priority from Japanese Patent Application No. 2006-238119, filed on Sep. 1, 2006, the entire contents of which are incorporated herein by reference.

BACKGROUND OF THE INVENTION

1. Field of the Invention

The present invention relates to a semiconductor device, and particularly relates to a semiconductor device incorporating a non-volatile semiconductor memory (such as a ferroelectric memory).

2. Description of the Related Art

Generally, in a semiconductor device incorporating a ferroelectric memory, a voltage supplied via an external power supply pin or a voltage obtained by boosting/stepping down the voltage supplied via the external power supply pin is used as a power supply voltage of the ferroelectric memory. Among the semiconductor devices each incorporating a ferroelectric memory, in an IC card (Integrated Circuit Card), a RFID (Radio Frequency Identification), and so on, a stability capacitance (constituted of a ferroelectric capacitance) is often connected between a power supply pin of the ferroelectric memory and a ground line in order to stabilize the power supply voltage of the ferroelectric memory.

The ferroelectric memory has a failure mode regarding data retention called a retention failure, and hence it needs to be guaranteed to retain write data for a predetermined time or more in a power-on state (state in which the power supply voltage is being supplied) and retain write data for a predetermined time or more in a power-off state (state in which the power supply voltage is not being supplied).

Therefore, in a test process of the semiconductor device incorporating the ferroelectric memory, a screening test for a retention failure when the ferroelectric memory is powered off (power-off retention test) is performed in the following steps. First, predetermined data is written into the ferroelectric memory. Subsequently, the voltage supply from an external testing apparatus to an external power supply pin of the semiconductor device is stopped to stop the supply of the power supply voltage to the ferroelectric memory. Then, in a predetermined time after the supply of the power supply voltage to the ferroelectric memory is stopped, the voltage supply from the external testing apparatus to the external power supply pin of the semiconductor device is resumed to resume the supply of the power supply voltage to the ferroelectric memory. Thereafter, data is read from the ferroelectric memory, and the presence or absence of the retention failure is determined by comparing the read data and the predetermined data.

Moreover, Japanese Unexamined Patent Application Publication No. 2000-299000 discloses a non-volatile semiconductor memory which is configured to be able to supply a voltage obtained by stepping down a power supply voltage to a memory block in addition to the power supply voltage and to ensure reliable data retention even when the memory block is constituted of a ferroelectric memory. Japanese Unexamined Patent Application Publication No. 2004-61114 discloses a self-diagnosis test circuit which can realize a reduction in test time, an improvement in yield, and an increase in test coverage in a test of a semiconductor device.

In the conventional semiconductor device, to stop the supply of the power supply voltage to the ferroelectric memory in the power-off retention test of the ferroelectric memory, the supply of the voltage from the external testing apparatus to the external power supply pin of the semiconductor device needs to be stopped. Therefore, during the power-off retention test of the ferroelectric memory, the supply of the power supply voltage to functional blocks except the ferroelectric memory is also stopped. This causes a problem that during the power-off retention test of the ferroelectric memory, the functional blocks except the memory block cannot be tested, thereby increasing a test time of the semiconductor device.

Further, with the stability capacitance, even if the voltage supply from the external testing apparatus to the external power supply pin of the semiconductor device is stopped to stop the supply of the power supply voltage to the ferroelectric memory in the power-off retention test thereof, the voltage is supplied to the ferroelectric memory only for a time taken for discharging an electric charge accumulated in the stability capacitance. Hence, whit the stability capacitance, it is necessary to lengthen the time for stopping of the voltage supply from the external testing apparatus to the external power supply pin of the semiconductor device by the waiting time for the completion of discharge of the electric charge accumulated in the stability capacitance, which causes a problem of an increase in the test time of the semiconductor device.

SUMMARY OF THE INVENTION

An object of the present invention is to reduce a test time of a semiconductor device incorporating a non-volatile semiconductor memory.

In a first aspect of the present invention, a semiconductor device includes plural functional blocks, a voltage supply circuit, a cut-off circuit, and a self test circuit. The plural functional blocks include a non-volatile memory block. For example, the memory block is constituted of a ferroelectric memory. The voltage supply circuit supplies a power supply voltage to the functional blocks. The cut-off circuit cuts off the supply of the power supply voltage from the voltage supply circuit to the memory block. The self test circuit performs tests of the functional blocks. In a data retention test of the memory block, the self test circuit instructs the cut-off circuit to start an operation after writing predetermined data into the memory block, and instructs the cut-off circuit to stop the operation to check retention of the predetermined data in the memory block in a predetermined time after the instruction to the cut-off circuit to start the operation.

For example, the semiconductor device further includes a stability capacitance and a discharge circuit. The stability capacitance is connected between a power supply pin of the memory block and a ground line. For example, the stability capacitance is constituted of a ferroelectric capacitance. The discharge circuit discharges an electric charge accumulated in the stability capacitance. In the data retention test of the memory block, the self test circuit instructs the discharge circuit to start an operation along with the instruction to the cut-off circuit to start the operation, and instructs the discharge circuit to stop the operation along with the instruction to the cut-off circuit to stop the operation.

In the above first aspect, in the data retention test of the memory block by the self test circuit, the supply of the power supply voltage from the voltage supply circuit to the memory block is cut off, but the supply of the power supply voltage from the voltage supply circuit to the functional blocks except the memory block is not cut off. Hence, the self test circuit can perform tests of the functional blocks except the memory block in parallel with performing the data retention test of the memory block.

Further, in the data retention test of the memory block by the self test circuit, the electric charge accumulated in the stability capacitance is discharged along with cut off of the supply of the power supply voltage from the voltage supply circuit to the memory block. Therefore, in the data retention test of the memory block by the self test circuit, the time taken for cutting off the supply of the power supply voltage from the power supply circuit to the memory block does not need to include waiting time for the completion of discharge of the electric charge accumulated in the stability capacitance. In the first aspect described above, the test time of the semiconductor device can be greatly reduced, which contributes to cost reduction.

In a preferred example of the first aspect of the present invention, the cut-off circuit includes a voltage supply control switch. The voltage supply control switch is connected between a power supply line and the power supply pin of the memory block, the power supply line being supplied with the power supply voltage by the voltage supply circuit. The voltage supply control switch is turned off in response to the instruction from the self test circuit to the cut-off circuit to start the operation, and turned on in response to the instruction from the self test circuit to the cut-off circuit to stop the operation. Consequently, the cut-off circuit which cuts off the supply of the power supply voltage from the voltage supply circuit to the memory block can be easily constituted.

In a preferred example of the first aspect of the present invention, the discharge circuit includes a discharge control switch. The discharge control switch is connected between the power supply pin of the memory block and the ground line. The discharge control switch is turned on in response to the instruction from the self test circuit to the discharge circuit to start the operation, and turned off in response to the instruction from the self test circuit to the discharge circuit to stop the operation. Consequently, the discharge circuit which discharges the electric charge accumulated in the stability capacitance can be easily constituted.

In a second aspect of the present invention, a semiconductor device includes plural functional blocks, a voltage supply circuit, a cut-off circuit, and a self test circuit. The plural functional blocks include a non-volatile memory block. The voltage supply circuit supplies a first power supply voltage to the memory block and supplies a second power supply voltage to at least one of the functional blocks except the memory block. For example, the voltage supply circuit includes first and second voltage generating circuits. The first voltage generating circuit generates the first power supply voltage using an external input voltage, and the second voltage generating circuit generates the second power supply voltage by stepping down the first power supply voltage. Alternatively, the first voltage generating circuit generates the second power supply voltage using the external input voltage, and the second voltage generating circuit generates the first power supply voltage by boosting the second power supply voltage. The cut-off circuit cuts off the supply of the first power supply voltage from the voltage supply circuit to the memory block. The self test circuit performs tests of the functional blocks. In a data retention test of the memory block, the self test circuit instructs the cut-off circuit to start an operation after writing predetermined data into the memory block, and instructs the cut-off circuit to stop the operation to check retention of the predetermined data in the memory block in a predetermined time after the instruction to the cut-off circuit to start the operation.

For example, the semiconductor device further includes a stability capacitance and a discharge circuit. The stability capacitance is connected between a power supply pin of the memory block and a ground line. The discharge circuit discharges an electric charge accumulated in the stability capacitance. In the data retention test of the memory block, the self test circuit instructs the discharge circuit to start an operation along with the instruction to the cut-off circuit to start the operation, and instructs the discharge circuit to stop the operation along with the instruction to the cut-off circuit to stop the operation.

The above second aspect can obtain the same effect as the above first aspect, although in the second aspect an operation voltage of the memory block is different from an operation voltage of at least one of the functional blocks except the memory block, and the semiconductor device has two separate internal power supply systems; one with the first power supply voltage and the other with the second power supply voltage.

BRIEF DESCRIPTION OF THE DRAWINGS

The nature, principle, and utility of the invention will become more apparent from the following detailed description when read in conjunction with the accompanying drawings in which like parts are designated by identical reference numbers, in which.

DESCRIPTION OF THE PREFERRED EMBODIMENT

Embodiments of the present invention will be described below using the drawings.

Figure 1:
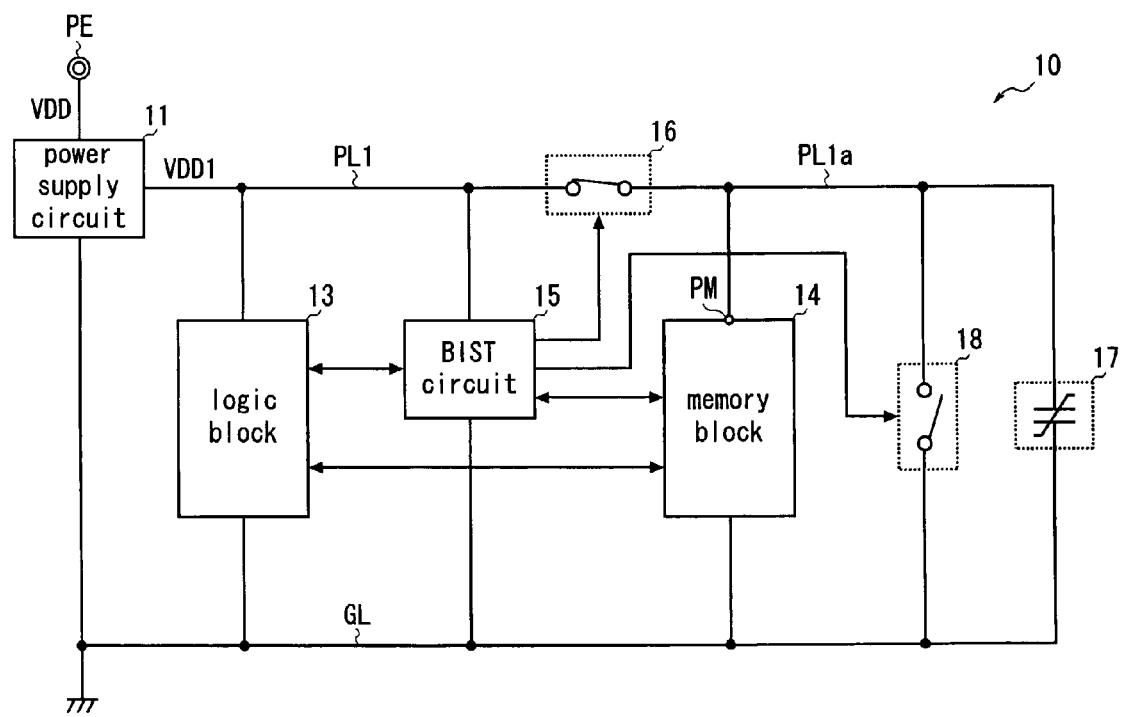
FIG. 1 is a block diagram showing a first embodiment of the present invention.

FIG. 1 shows a first embodiment of the present invention. A semiconductor device 10 of the first embodiment includes a power supply circuit 11, a logic block 13, a memory block 14, a BIST (Built-In Self Test) circuit 15, a voltage supply control switch 16, a stability capacitance 17, and a discharge control switch 18. The power supply circuit 11 generates a power supply voltage VDD1 using an external input voltage VDD (voltage supplied from outside via a power supply pin PE) and supplies the power supply voltage VDD1 to a power supply line PL1.

The logic block 13 embodies a processor function, a timer function, a communication interface function, and so on. The logic block 13 can perform a read access and a write access to the memory block 14. The memory block 14 is constituted of a ferroelectric memory including plural memory cells (each constituted of a ferroelectric capacitance and a transfer transistor) arranged in a matrix. In the memory block 14, the ferroelectric capacitance and the transfer transistor which constitute the memory cell are connected in series between a plate line and a bit line, and a gate of the transfer transistor is connected to a word line.

The BIST circuit 15 performs various tests of the logic block 13 and the memory block 14 (an operation test of the logic block 13, an operation test of the memory block 14, a power-on retention test/power-off retention test of the memory block 14, and so on). The BIST circuit 15 performs on/off control of the voltage supply control switch 16 and the discharge control switch 18 when performing the power-off retention test of the memory block 14. Details of this operation will be described later using FIG. 2.

The voltage supply control switch 16 is provided to cut off the supply of the power supply voltage VDD1 from the power supply circuit 11 to a power supply pin PM of the memory block 14 and connected between the power supply line PL1 and a power supply line PL1*a* (power supply pin PM of the memory block 14). The power supply control switch 16 is turned on/off in response to an instruction of the BIST circuit 15. The stability capacitance 17 is provided to stabilize a voltage (voltage of the power supply line PL1*a*) supplied to the power supply pin PM of the memory block 14 and connected between the power supply line PL1*a* (power supply pin PM of the memory block 14) and a ground line GL. The stability capacitance 17 is constituted of a ferroelectric capacitance. The discharge control switch 18 is provided to discharge an electric charge accumulated in the stability capacitance 17 and connected between the power supply line PL1*a* (power supply pin PM of the memory block 14) and the ground line GL. The discharge control switch 18 is turned on/off in response to an instruction of the BIST circuit 15.

Figure 2:
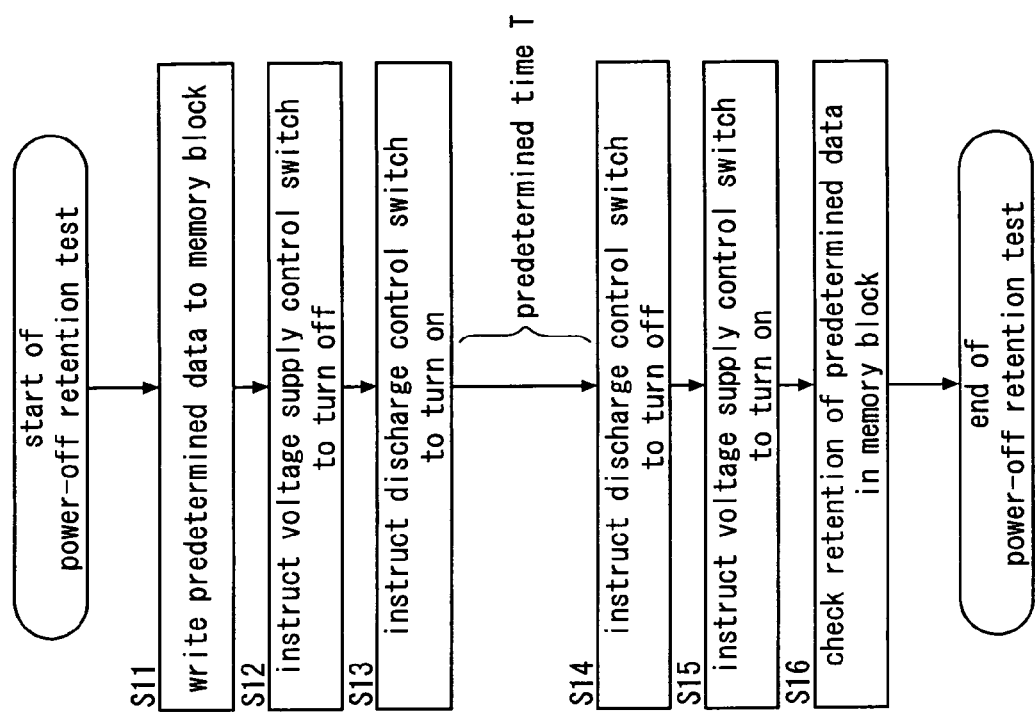
FIG. 2 is a flowchart showing the operation of a BIST circuit in the first embodiment.

FIG. 2 shows the operation of the BIST circuit in the first embodiment. When performing the power-off retention test of the memory block 14, the BIST circuit 15 operates as follows. First, the BIST circuit 15 writes predetermined data into the memory block 14 (step S11). Then, the BIST circuit 15 gives an instruction to turn off the voltage supply control switch 16 (step S12). Consequently, the voltage supply control switch 16 is turned off, the power supply line PL1 and the power supply line PL1*a* are disconnected, and the supply of the power supply voltage VDD1 from the power supply circuit 11 to the memory block 14 is cut off. Subsequently, the BIST circuit 15 gives an instruction to turn on the discharge control switch 18 (step S13). Consequently, the discharge control switch 18 is turned on, and the electric charge accumulated in the stability capacitance 17 is immediately discharged to the ground line GL.

Then, in a predetermined time T after the instruction to turn on the discharge control switch 18 is given, the BIST circuit 15 gives an instruction to turn off the discharge control switch 18 (step S14). Hence, the discharge control switch 18 is turned off. Subsequently, the BIST circuit 15 gives an instruction to turn on the voltage supply control switch 16 (step S15). Consequently, the voltage supply control switch 16 is turned on, the power supply line PL1 and the power supply line PL1*a* are connected, and the supply of the power supply voltage VDD1 from the power supply circuit 11 to the memory block 14 is resumed. After this, the BIST circuit 15 checks retention of the predetermined data in the memory block 14 (step S16). To put it in more detail, after reading data from the memory block 14, the BIST circuit 15 determines the presence or absence of a retention failure by a comparison between the read data and the predetermined data (data written into the memory block 14 in step S11).

In the above first embodiment, when the BIST circuit 15 performs the power-off retention test of the memory block 14, the supply of the power supply voltage VDD1 from the power supply circuit 11 to the memory block 14 is cut off, but the supply of the power supply voltage VDD1 from the power supply circuit 11 to the logic block 13 is not cut off. Hence, the BIST circuit 15 can perform an operation test of the logic block 13 in parallel with performing the power-off retention test of the memory block 14.

Further, when the BIST circuit 15 performs the power-off retention test of the memory block 14, the supply of the power supply voltage VDD1 from the power supply circuit 11 to the memory block 14 is cut off, and along with this, the electric charge accumulated in the stability capacitance 17 is discharged. Therefore, when the BIST circuit 15 performs the power-off retention test of the memory block 14, the time (predetermined time T) taken for cutting off the supply of the power supply voltage VDD1 from the power supply circuit 11 to the memory block 14 does not need to include waiting time for the completion of discharge of the electric charge accumulated in the stability capacitance 17. In the first embodiment described above, the test time of the semiconductor device 10 can be greatly reduced, which contributes to cost reduction.

Figure 3:
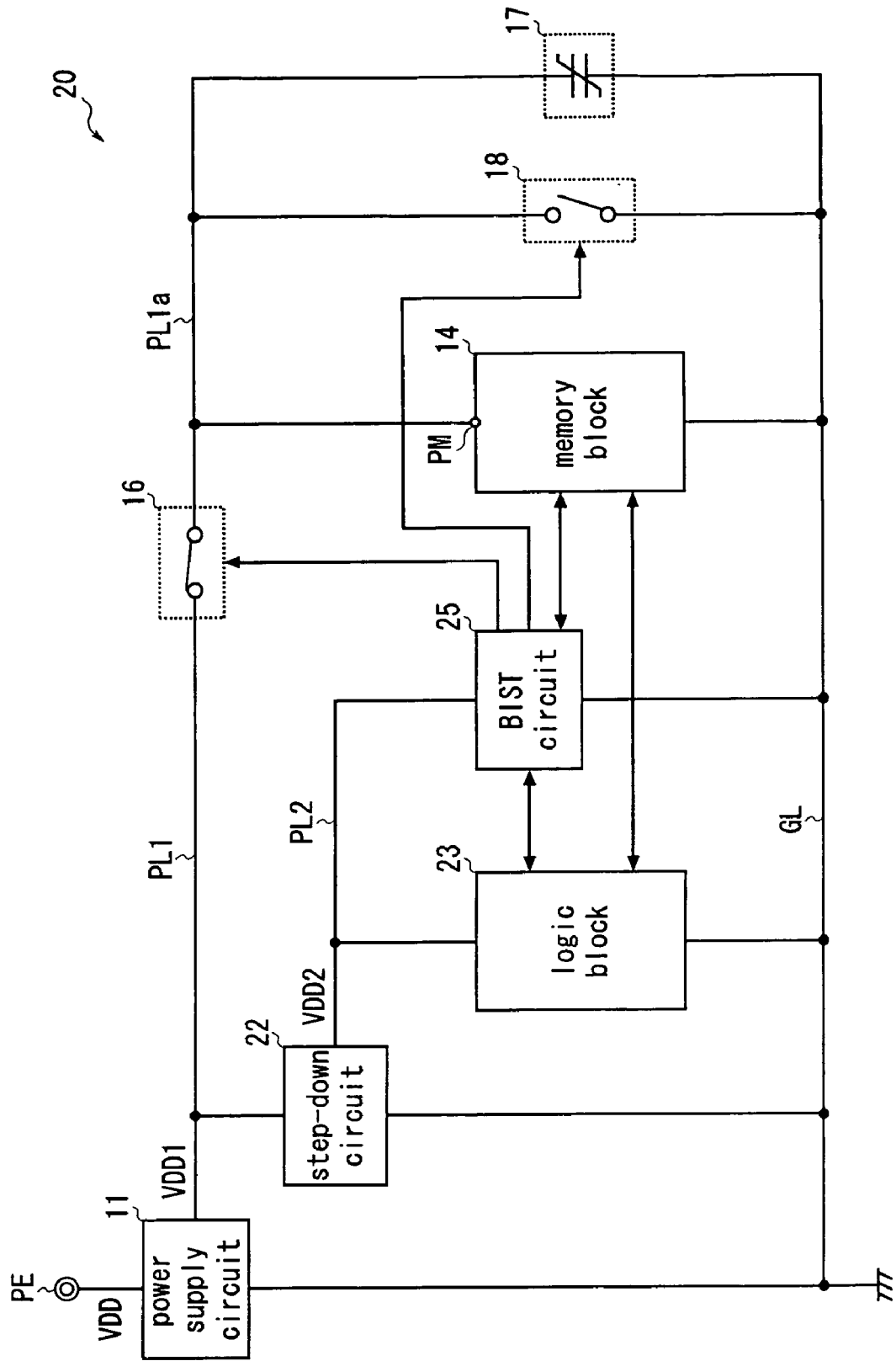
FIG. 3 is a block diagram showing a second embodiment of the present invention.

FIG. 3 shows a second embodiment of the present invention. The second embodiment (FIG. 3) will be described below, but the same reference symbols as used in the first embodiment will be used to designate the same elements as described in the first embodiment (FIG. 1), and a detailed description thereof will be omitted. A semiconductor device 20 of the second embodiment is the same as the semiconductor device 10 of the first embodiment except that it includes a step-down circuit 22 and includes a logic block 23 and a BIST circuit 25 instead of the logic block 13 and the BIST circuit 15.

The step-down circuit 22 steps down the power supply voltage VDD1 (voltage of the power supply line PL1) to generate a power supply voltage VDD2 and supplies the power supply voltage VDD2 to a power supply line PL2. The logic block 23 and the BIST circuit 25 are the same as the logic block 13 and the BIST circuit 15 except that they receive the power supply voltage VDD2 supplied to the power supply line PL2 instead of the power supply voltage VDD1 supplied to the power supply line PL1 (except that operation voltages are different).

In the above second embodiment, the operation voltage of the logic block 23 is lower than the operation voltage of the memory block 14, and an internal power supply system of the semiconductor device 20 is separated into two systems: a power supply system for the memory block 14 (power supply system with the power supply voltage VDD1 generated by the power supply circuit 11) and a power supply system for the logic block 23 (power supply system with the power supply voltage VDD2 generated by the step-down circuit 22), and also in such a case, the same effect as in the above first embodiment can be obtained.

Figure 4:
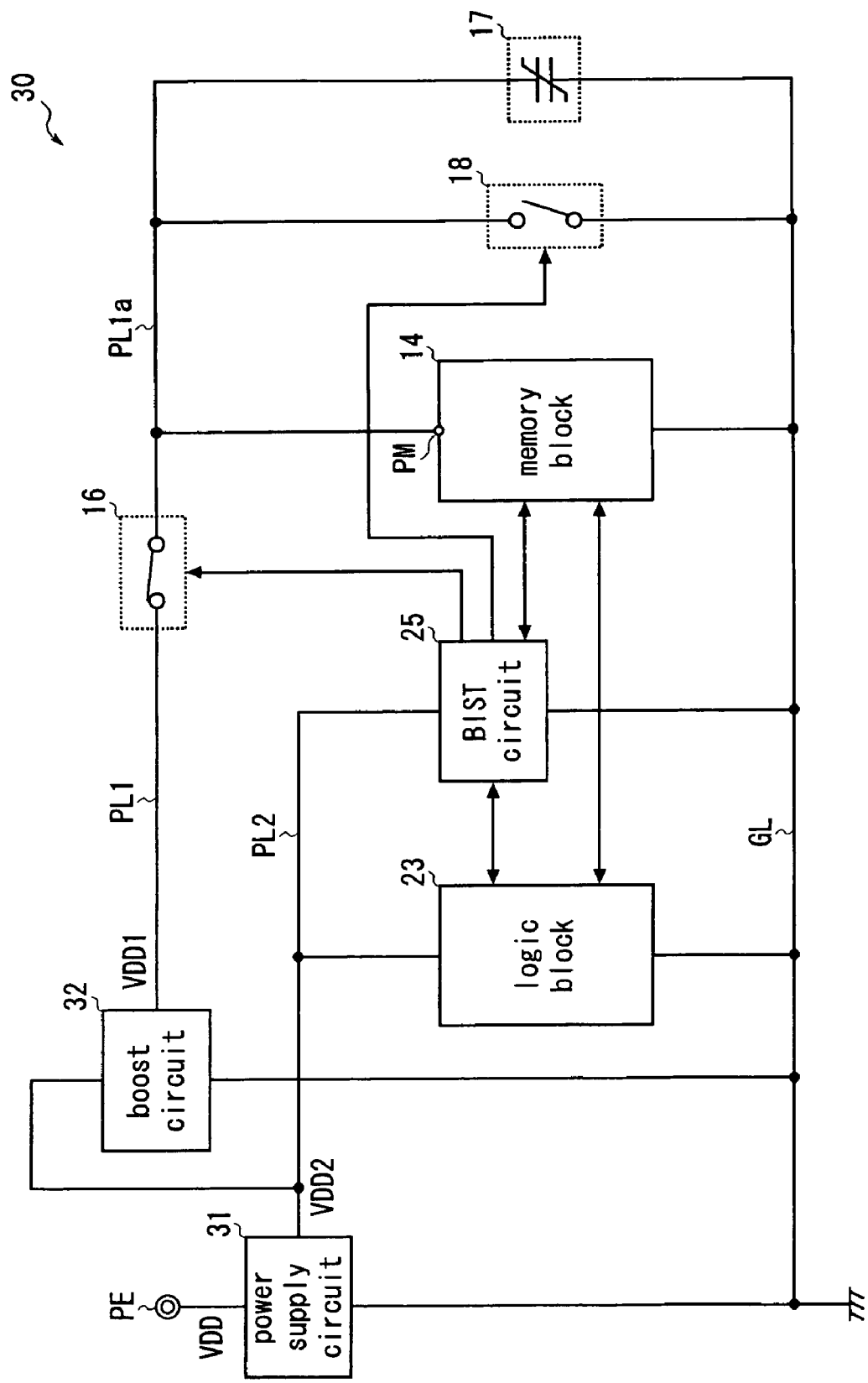
FIG. 4 is a block diagram showing a third embodiment of the present invention.

FIG. 4 shows a third embodiment of the present invention. The third embodiment (FIG. 4) will be described below, but the same reference symbols as used in the first and second embodiments will be used to designate the same elements as described in the first and second embodiments (FIG. 1 and FIG. 3), and a detailed description thereof will be omitted. A semiconductor device 30 of the third embodiment is the same as the semiconductor device 20 of the second embodiment except that it includes a power supply circuit 31 and a boost circuit 32 instead of the power supply circuit 11 and the step-down circuit 22.

The power supply circuit 31 generates the power supply voltage VDD2 using the external input voltage VDD (voltage supplied from outside via the power supply pin PE) and supplies the power supply voltage VDD2 to the power supply line PL2. The boost circuit 32 boosts the power supply voltage VDD2 (voltage of the power supply line PL2) to generate the power supply voltage VDD1 and supplies the power supply voltage VDD1 to the power supply line PL1.

In the above third embodiment, the operation voltage of the logic block 23 is lower than the operation voltage of the memory block 14, and an internal power supply system of the semiconductor device 30 is separated into two systems: a power supply system for the memory block 14 (power supply system of the power supply voltage VDD1 generated by the boost circuit 32) and a power supply system for the logic block 23 (power supply system of the power supply voltage VDD2 generated by the power supply circuit 31), and also in such a case, the same effect as in the above first embodiment can be obtained.

Incidentally, in the second embodiment, the example in which the operation voltage of the logic block 23 is lower than the operation voltage of the memory block 14 and the step-down circuit 22 which supplies the voltage (power supply voltage VDD2) obtained by stepping down the voltage (power supply voltage VDD1) of the power supply line PL1 to the power supply line PL2 is provided is described, but the present invention is not limited to this embodiment. Also when, for example, the operation voltage of the logic block 23 is higher than the operation voltage of the memory block 14 and instead of the step-down circuit 22, a boost circuit which supplies a voltage obtained by boosting the voltage of the power supply line PL1 to the power supply line PL2 is provided, the same effect can be obtained.

Further, in the third embodiment, the example in which the operation voltage of the logic block 23 is lower than the operation voltage of the memory block 14 and the boost circuit 32 which supplies the voltage (power supply voltage VDD1) obtained by boosting the voltage (power supply voltage VDD2) of the power supply line PL2 to the power supply line PL1 is provided is described, but the present invention is not limited to this embodiment. Also when, for example, the operation voltage of the logic block 23 is higher than the operation voltage of the memory block 14 and instead of the boost circuit 32, a step-down circuit which supplies a voltage obtained by stepping down the voltage of the power supply line PL2 to the power supply line PL1 is provided, the same effect can be obtained.

The invention is not limited to the above embodiments and various modifications may be made without departing from the spirit and scope of the invention. Any improvement may be made in part of all of the components.

What is claimed is:

1. A semiconductor device, comprising:
   plural functional blocks including a non-volatile memory block;
   a voltage supply circuit supplying a power supply voltage to said functional blocks;
   a cut-off circuit cutting off the supply of said power supply voltage from said voltage supply circuit to said memory block; and
   a self test circuit performing tests of said functional blocks, wherein
   in a data retention test of said memory block, said self test circuit instructs said cut-off circuit to start an operation after writing predetermined data into said memory block, and instructs said cut-off circuit to stop the operation to check retention of said predetermined data in said memory block in a predetermined time after the instruction to said cut-off circuit to start the operation,
   wherein the voltage supply circuit supplies the power supply voltage to at least one of the plural functional blocks other than the memory block while cutting off the supply of said power supply voltage from said voltage supply circuit to said memory block.

2. The semiconductor device according to claim 1, wherein:
   said cut-off circuit comprises a voltage supply control switch connected between a power supply line and a power supply pin of said memory block, the power supply line being supplied with said power supply voltage by said voltage supply circuit; and
   said voltage supply control switch is turned off in response to the instruction from said self test circuit to said cut-off circuit to start the operation, and turned on in response to the instruction from said self test circuit to said cut-off circuit to stop the operation.

3. The semiconductor device according to claim 1, further comprising:
   a stability capacitance connected between a power supply pin of said memory block and a ground line; and
   a discharge circuit discharging an electric charge accumulated in said stability capacitance, wherein
   in the data retention test of said memory block, said self test circuit instructs said discharge circuit to start an operation along with the instruction to said cut-off circuit to start the operation, and instructs said discharge circuit to stop the operation along with the instruction to said cut-off circuit to stop the operation.

4. The semiconductor device according to claim 3, wherein
   said discharge circuit comprises a discharge control switch connected between the power supply pin of said memory block and said ground line, and
   said discharge control switch is turned on in response to the instruction from said self test circuit to said discharge circuit to start the operation and turned off in response to the instruction from said self test circuit to said discharge circuit to stop the operation.

5. The semiconductor device according to claim 3, wherein
   said stability capacitance is constituted of a ferroelectric capacitance.

6. The semiconductor device according to claim 1, wherein
   said memory block is constituted of a ferroelectric memory.

7. A semiconductor device, comprising:
   plural functional blocks including a non-volatile memory block;
   a voltage supply circuit supplying a first power supply voltage to said memory block and supplying a second power supply voltage to at least one of said functional blocks except said memory block;
   a cut-off circuit cutting off the supply of said first power supply voltage from said voltage supply circuit to said memory block; and
   a self test circuit performing tests of said functional blocks, wherein
   in a data retention test of said memory block, said self test circuit instructs said cut-off circuit to start an operation after writing predetermined data into said memory block, and instructs said cut-off circuit to stop the operation to check retention of said predetermined data in said memory block in a predetermined time after the instruction to said cut-off circuit to start the operation,
   wherein the voltage supply circuit supplies the second power supply voltage to at least one of the plural functional blocks other than the memory block while cutting off the supply of said first power supply voltage from said voltage supply circuit to said memory block.

8. The semiconductor device according to claim 7, further comprising:
   a stability capacitance connected between a power supply pin of said memory block and a ground line; and
   a discharge circuit discharging an electric charge accumulated in said stability capacitance, wherein
   in the data retention test of said memory block, said self test circuit instructs said discharge circuit to start an operation along with the instruction to said cut-off circuit to start the operation, and instructs said discharge circuit to stop the operation along with the instruction to said cut-off circuit to stop the operation.

9. The semiconductor device according to claim 7, wherein said voltage supply circuit comprises:
a first voltage generating circuit generating said first power supply voltage using an external input voltage; and
a second voltage generating circuit generating said second power supply voltage by stepping down said first power supply voltage.

10. The semiconductor device according to claim 7, wherein
said voltage supply circuit comprises:
a first voltage generating circuit generating said second power supply voltage using an external input voltage; and
a second voltage generating circuit generating said first power supply voltage by boosting said second power supply voltage.

* * * * *